United States Patent [19]
Ishida

[11] Patent Number: 5,846,096
[45] Date of Patent: *Dec. 8, 1998

[54] PC CARD ELECTRICAL CONNECTOR WITH EXPANDABLE EJECTOR

[75] Inventor: Mitsuo Ishida, Tokyo, Japan

[73] Assignee: Hirose Electric Co., Ltd., Tokyo, Japan

[ * ] Notice: The term of this patent shall not extend beyond the expiration date of Pat. No. 5,536,180.

[21] Appl. No.: 807,466

[22] Filed: Feb. 27, 1997

[30] Foreign Application Priority Data

Feb. 29, 1996 [JP] Japan .................................. 8-067405

[51] Int. Cl.⁶ .................................................. H01R 13/62
[52] U.S. Cl. ........................................... 439/159; 439/157
[58] Field of Search ................................... 439/159, 152, 439/153, 154, 155, 156, 157, 160, 372

[56] References Cited

U.S. PATENT DOCUMENTS 5,536,180  7/1996  Ishida et al. .............................. 439/159
5,599,197  2/1997  Ishida et al. .............................. 439/159

FOREIGN PATENT DOCUMENTS 4133369  12/1992  Japan .

Primary Examiner—P. Austin Bradley
Assistant Examiner—Tho D. Ta
Attorney, Agent, or Firm—Kanesaka & Takeuchi

[57] ABSTRACT

A PC card electrical connector includes a case (40); an ejector (20) having a front button (21) and a rear arm (22); a first spring (27) for forwardly biasing the ejector; an intermediate bar (10) for abutment with the ejector having a cam follower (13); a second spring (49) for biasing the intermediate bar toward the rear arm of the ejector; an ejector bar (5) for abutment with the intermediate bar; a cam member (63) movable on the bottom of the case and having an engaging portion; a first cam channel (I) provided on the ejector so as to engage the cam member such that when a PC card is inserted, the engaging portion is held at a lock position where the ejector button is held at a depressed position and, when the ejector button is depressed, the engaging portion is released from the lock position and, when the ejector button is depressed again, the ejector is moved to a projected position while the engaging portion is returned to the lock position; and a second cam channel (II) provided on the bottom of the case so as to engage the cam follower such that upon first depression, the intermediate bar is placed against the rear arm and, upon second depression, the intermediate bar is brought to the position opposed to the ejector, thereby enabling to eject the PC card from the receiving slot.

2 Claims, 6 Drawing Sheets

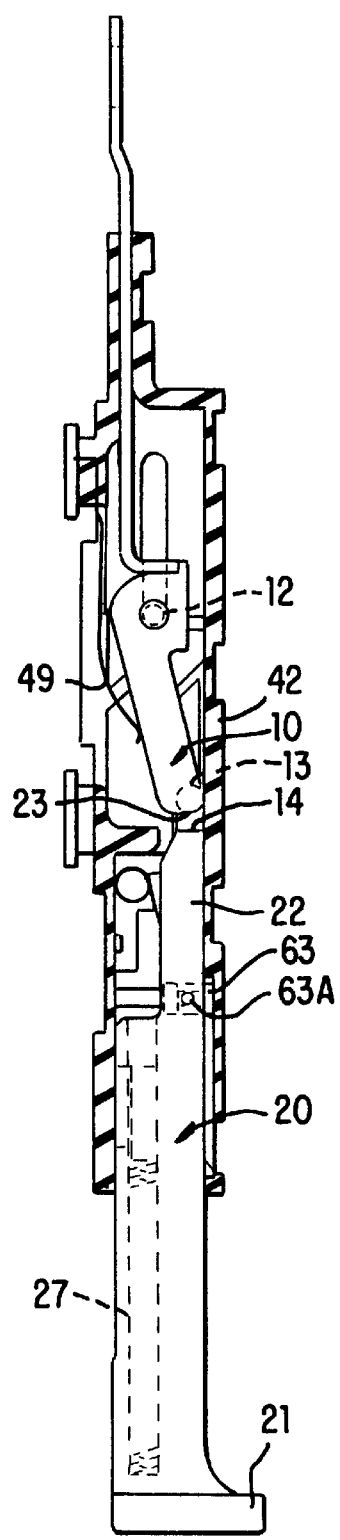
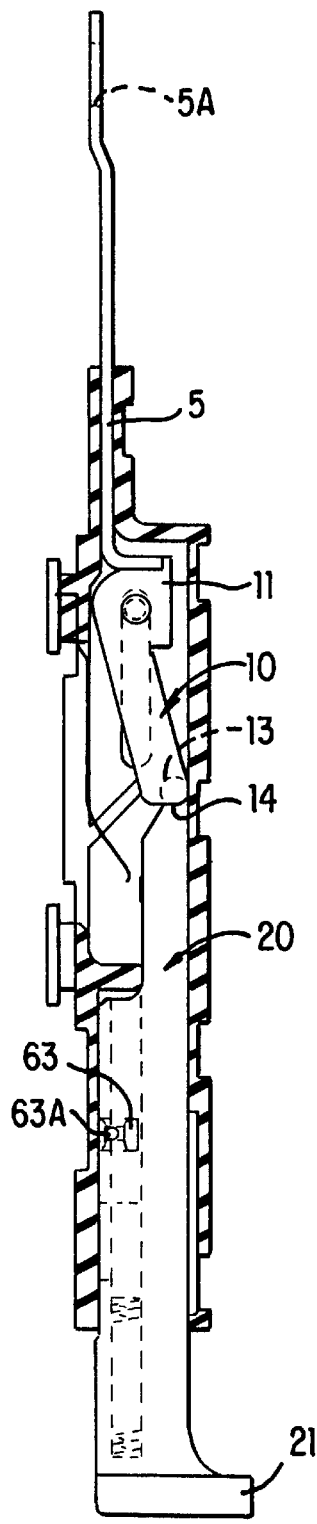
FIG. 5
FIG. 6

PC CARD ELECTRICAL CONNECTOR WITH EXPANDABLE EJECTOR

BACKGROUND OF THE INVENTION

1. Field of the Invention

The present invention relates to electrical connectors for PC cards.

2. Description of the Related Art

Japanese UM patent application publication No. 133,369/92 discloses a connector of this type. As FIG. 9 shows, the connector includes a housing 81 having a receiving slot 83 into which a PC card 82 is inserted up to almost its end. A movable plate 84 is provided in a rear portion of the receiving slot for receiving a leading portion of the PC card 82. A rear edge of the movable plate 84 is bent to form an abutment portion 85 for abutment with a front end of the PC card 82. A slot 86 is provided in the movable plate 84 for receiving a column 87 which extends upwardly from a bottom of the housing 81. An ejector lever 88 is attached to the column 87 for rotation. A slot 89 is provided in an end of the ejector lever 88 for engagement with a projection 90 of the movable plate 84. The other end of the ejector lever 88 projects from a side of the receiving slot 83 through a slot 91A of a movable ejector bar 91 for slidable engagement with the movable ejector bar 91. An ejector button 92 is attached to the other end of the ejector bar 91 for manipulating the ejector bar 91. When the PC card 82 is inserted, its rear end is substantially flush with the ejector button 92.

When the PC card is used, the ejector button 92 is located at a position shown by a solid line. When the PC card is removed, the ejector button 92 is depressed in a direction A to a position shown by a broken line. Consequently, the ejector lever 88 is turned to move the movable plate 84 forwardly so that the abutment portion 85 pushes the PC card rearwardly, enabling the user to remove the PC card 82.

When the PC card 82 is housed in the receiving slot 83, the ejector button 92 is located at the position substantially flush with or does not project from the rear end of the PC card 82 so that it is difficult to push the ejector button 92 for removal of the PC card 82. Also, the PC card can be pushed accidentally along with the ejector bottom 92. If the ejector button 92 is made longer to project beyond the end of the PC card, it is too easy to push accidentally.

SUMMARY OF THE INVENTION

Accordingly, it is an object of the invention to provide a PC card electrical connector having an ejector button projected only a time when a PC card is removed, thereby minimizing accidental depression of the ejector button.

According to the invention there is provided a PC card electrical connector which includes a housing having a receiving slot for receiving a PC card; a case having a bottom, an outside wall and an inside wall adjacent to the receiving slot; an ejector having a front button and a stepped-down rear arm with a work face for forming a stepped space with the inside wall; a first spring member provided between the case and the ejector for forwardly biasing the ejector in a longitudinal direction; an intermediate bar having a bottom, a rear work face, a front load face for abutment with the work face of the ejector, and a cam follower provided on the bottom near the front load face; a second spring member attached to the inside wall of the case for biasing the load face of the intermediate bar toward the rear arm of the ejector; an ejector bar having a front load face for abutment with the rear work face of the intermediate bar; a cam member movable in a direction perpendicular to the longitudinal direction on the bottom of the case and having an engaging portion; a first cam channel provided on the ejector so as to engage the cam member such that when a PC card is inserted, the engaging portion is held at a lock position where the ejector button is held at a depressed position and, when the ejector button is depressed firstly (first depression), the engaging portion is released from the lock position and, when the ejector button is depressed secondly (second depression), the ejector is moved to a projected position while the engaging portion is returned to the lock position; and a second cam channel provided on the bottom of the case so as to engage the cam follower such that upon insertion of the PC card and the first depression, the load face of the intermediate bar is placed in the stepped space and, upon the second depression, the load face of the intermediate bar is brought to a position opposed to the work face of the ejector, thereby enabling to eject the PC card from the receiving slot.

With such a PC card electrical connector, the PC card is removed as follows;

(1) When a PC card is inserted into the slot of the housing. The leading end of the PC card pushes the ejector bar through a transmission mechanism. At this point, the load face of the intermediate bar is in the stepped space of the ejector and the engaging portion of the movable member is at the lock position of the first cam channel. Consequently, the ejector is locked at the retreated position during the use of the PC card.

(2) To remove the PC card, the ejector button is depressed (first depression) to unlock the engaging portion of the movable member. Upon release of the first depression, the ejector is moved forward by the spring member so that the ejector button projects from the end of the PC card.

(3) When the ejector is moved forward, the load face of the intermediate bar is brought to a position opposed to the work face of the ejector for abutment.

(4) Under such conditions, the ejector button is depressed again (second depression). The work face of the ejector pushes the intermediate bar rearwardly, which in turn pushes the ejector bar rearwardly.

(5) When the ejector bar is moved rearwardly, the transmission mechanism changes the direction of the force and transmits it to the PC card. Thus, the PC card is removed from the connector. The engaging portion of the movable member engages the first cam channel to lock the ejector at the depressed position, keeping the ejector button from projecting beyond the end of the PC card.

BRIEF DESCRIPTION OF THE INVENTION

FIG. 5 is a longitudinal section of the electrical connector showing how to remove the PC card;

FIG. 6 is a longitudinal section of the electrical connector showing how to remove the PC card;

DESCRIPTION OF THE PREFERRED EMBODIMENT

Figure 1:
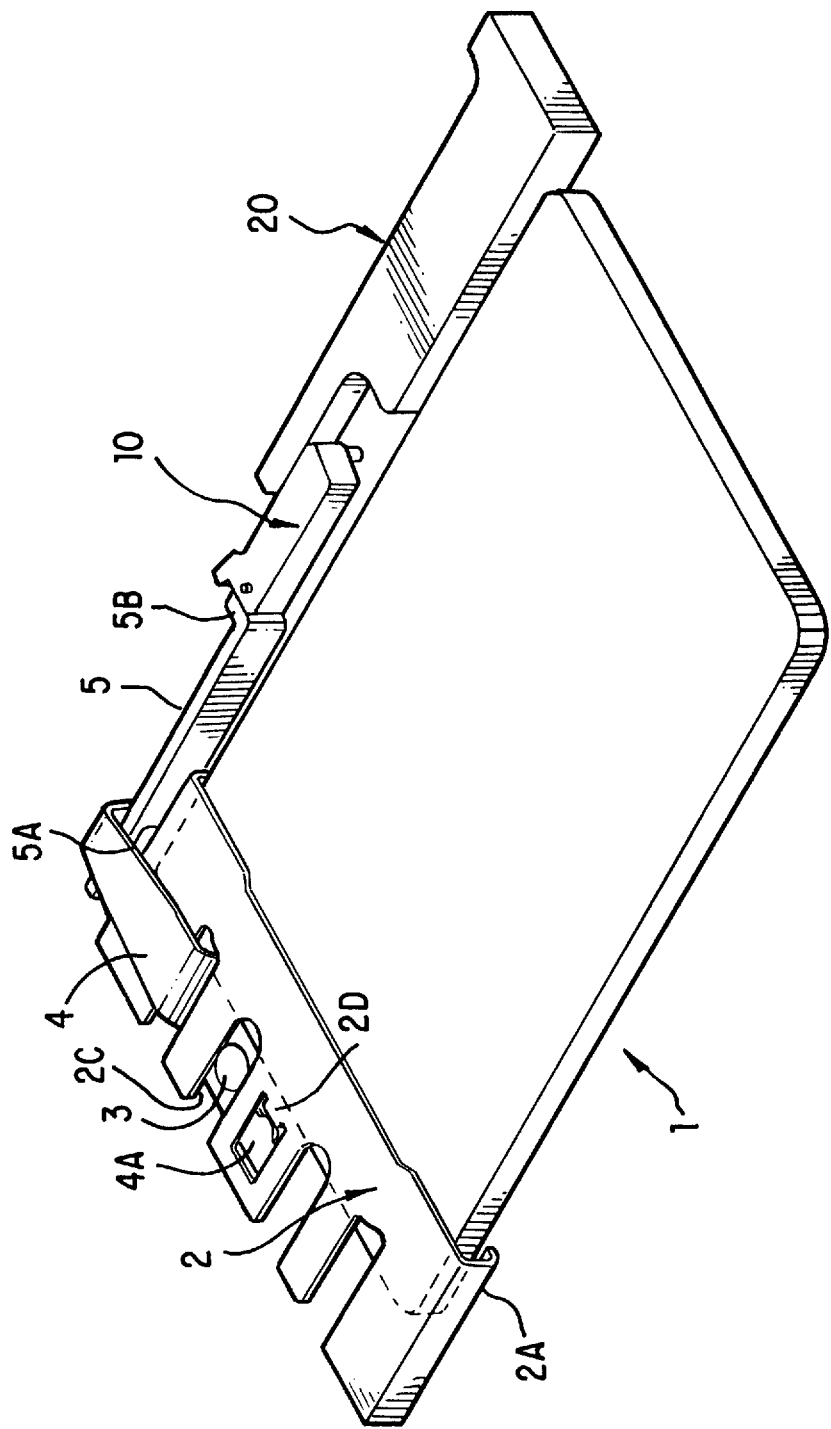
FIG. 1 is a perspective view of essential part of a PC card electrical connector according to an embodiment of the invention.

In FIG. 1, a housing is omitted to show a PC card 1 inserted in a receiving slot and an ejector mechanism for ejecting the PC card. A leading end of the PC card 1 is received by a movable plate 2 which forms a transmission mechanism together with a pivot 3, an ejector lever 4, and an ejector bar 5. The movable plate 2 is movable in the receiving slot in a longitudinal direction and has L-shaped guide portions 2A on opposite sides for guiding the PC card 1. A U-shaped notch 2C extends forwardly from a rear edge of the movable plate 2 for receiving the pivot 3 which extends upwardly from the housing bottom.

The ejector lever 4 is attached to the pivot 3 for rotation and has a semi-circular working point 4A for abutment with a load point 2D of the movable plate 2. The other end of the ejector lever 4 is bent in a U-shape for engagement with a slot 5A of the ejector bar 5 and works as an effort point.

The ejector bar 5 extends forwardly in a operational cavity of the housing and has a front end 5B bent in an L-shape. An intermediate bar 10 and an ejector 20 are provided in front of the ejector bar 5.

Figure 2:
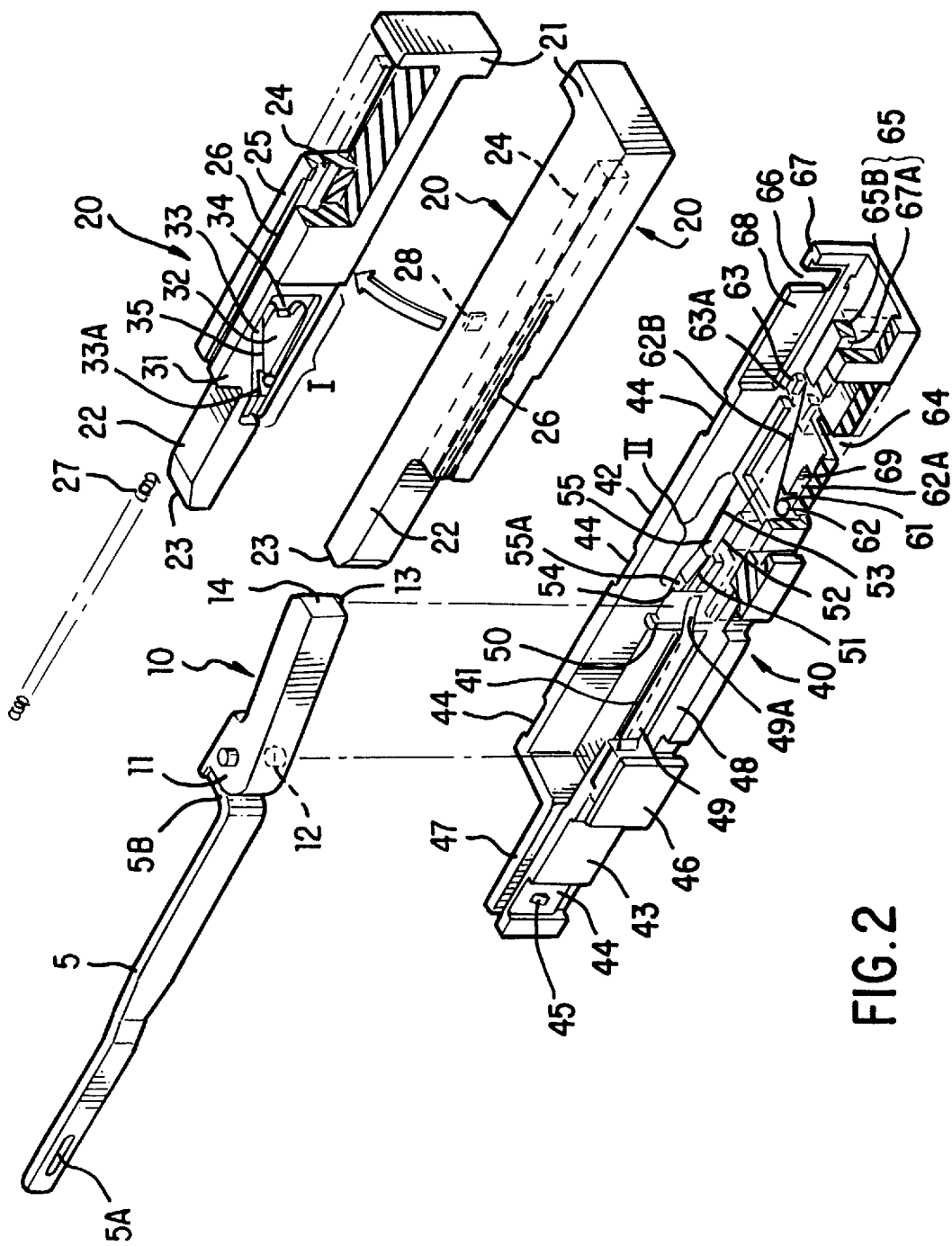
FIG. 2 is an exploded perspective view of an ejector mechanism for the electrical connector.

As FIG. 2 shows, the intermediate bar 10 has a rear abutment 11 for abutment with the front end 5B of the ejector bar 5. A pivot 12 is provided near the rear abutment 11 for engagement with a channel 41 provided on the bottom of a case 40 which is attached to the housing. The intermediate bar 10 is not only rotatable about the pivot 12 but also movable in the longitudinal direction along the channel 41. A cam follower 13 in the form of a stud is provided on the front bottom of the intermediate bar 10 and a flat load surface 14 is provided on the front end.

In FIG. 2, the ejector 20 is illustrated at a position close to the intermediate bar 10 and a position rotated by 90° about a longitudinal axis so that its bottom becomes visible. The ejector 20 has an ejector button 21 and a stepped-down rear arm 22 to provide a space from an inside wall 43 of the case 40. The work face 23 is provided at the rear end of the rear arm 22 for abutment with the load face 14 of the intermediate bar 10. A square hole 24 extends forwardly from the stepped portion toward the ejector button 21. A slit 26 is provided in a side 25 of the ejector 20 for communication with the square hole 24 and extends from the stepped portion to a middle point of the square hole 24. A compression spring 27 is inserted in the square hole as a spring means. An engaging projection 28 tapered rearwardly is provided on a side opposite to the side 25 for engagement with a front engaging portion 67 of the case 40 to prevent the ejector 20 from coming out of the case 40.

A first cam section I is provided on the bottom of the ejector 20. A heart-shaped island 32 and a cam channel 33 around the island 32 are provided on a bottom surface 31. A recess 34 is provided on a front edge of the heart-shaped island 32 which has a slant rear edge 35. The cam channel 33 receives an engaging portion of the cam member hereinafter described. A stepped tooth 33A is provided on the rear edge 35 to assure one-way movement of the engaging portion.

The case 40 for housing the ejector bar 5, the intermediate bar 10, and the ejector 20 has a U-shaped cross-section in a plane perpendicular to the longitudinal direction. Recesses 44 provided on the side walls 42 and 43 of the case 40 have a projection 45. A cover (not shown) is fitted in the case 40 after the ejector bar 5, the intermediate bar 10, and the ejector 20 are housed such that engaging holes of the cover engage the projections 45 to prevent separation of the cover.

A T-shaped attaching projection 46 is provided on the inside wall 43 of the case 40 and inserted into a groove on the housing to attach the case 40 to the housing. If the groove is provided on both sides of the housing, the case 40 is conveniently attached to either side of the housing.

An L-shaped wall 47 is provided at the rear end of the case 40 to cooperate the inside wall 43 for guiding the ejector bar 5. A cut-out 48 extends rearwardly from a midpoint of the inside wall 43, and a fine leaf spring 49 is attached to the rear edge of the cut-out 48. A front end 49A of the leaf spring 49 is curved outwardly so as to contact the intermediate bar 10. Consequently, the intermediate bar 10 is biased to turn counterclockwise about the pivot 12 toward the outside wall 42.

A second cam section II is provided in the central bottom of the case 40. A guiding ridge 50 diagonally intersects a line including the pivot 12 and the follower stud 13. An island projection 51 is provided in front of the guiding ridge 50 and has a rear end parallel to the guiding ridge 50. Slits 52 and 53 provided between the island projection 51 and the outside wall 42 communicate each other at a communication section 54 to form a cantilevered finger 55. A rear end of the cantilevered finger 55 extend from the rear face of the island projection 51. A rear portion 55A of the cantilevered finger 55 is bent so as to provide sloped and then stepped portions. Thus, a cam channel is formed such that the follower stud 13 of the intermediate bar 10, which is placed between the front face of the guiding projection 50 and the rear face of the island projection 51, moves around the island projection 51. The follower stud 13 moves rearwardly over the cantilevered finger 55 and, when it passes the rear portion 55A, is prevented from moving rearwardly by the stepped rear face and guided toward the island projection 51 against the leaf spring 49.

A mechanism is provided in front of the second cam section II for engagement with the first cam section I in the ejector 20 to provide the ejector 20 with a predetermined movement. A torsion coil spring 62 is put over a rod 61. Both ends of the coil spring 62 extend in tangential directions, and one end 62A is fitted in a groove 69 of the case 40 and the other end 62B engages an engaging stud 63B of a movable cam member 63. The cam member 63 is guided by a guide channel 64 which extends in a direction perpendicular to the longitudinal direction of the case 40. The cam member 63 is biased by the coil spring 62 toward the outside wall 42 of the case 40. When the ejector 20 is housed in the case 40, the engaging portion 63A of the cam member 63 is fitted in the cam channel 33 of the first cam section I of the ejector 20. A pressure portion 65 provided in front of the guiding groove 64 has a square head 65B projected from the inside wall 43 via a narrow portion 65A. The narrow portion 65A and the square head 65B are fitted in the slit 26 and the square hole 24 of the ejector 20, respectively.

A notch 66 is provided near the front end of the outside wall 42 of the case 40 to provide a front end engaging portion 67 with resiliency so that the engaging projection 28 of the ejector 20 pass the front end engaging portion 67 when the ejector 20 is inserted into the case 40 from the front end. When the ejector 20 is housed in the case 40, the engaging projection 28 engages the front end engaging portion 67 to prevent the ejector 20 from coming out of the case 40 unless the front end engaging portion 67 is deformed by applying a force. A shallow depression 68 is provided on the inside of the outside wall 42 so that the engaging projection 28 of the ejector 20 presents no problem.

Figure 7:
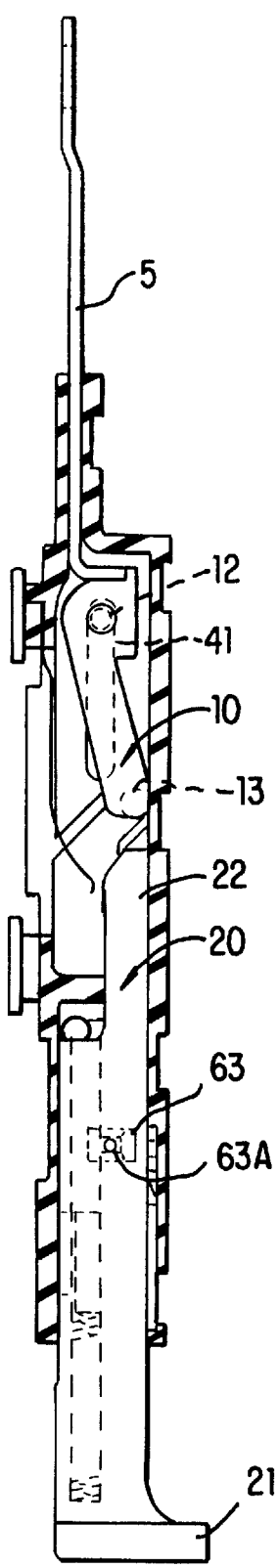
FIG. 7 is a longitudinal section of the electrical connector showing how to remove the PC card.
Figure 8:
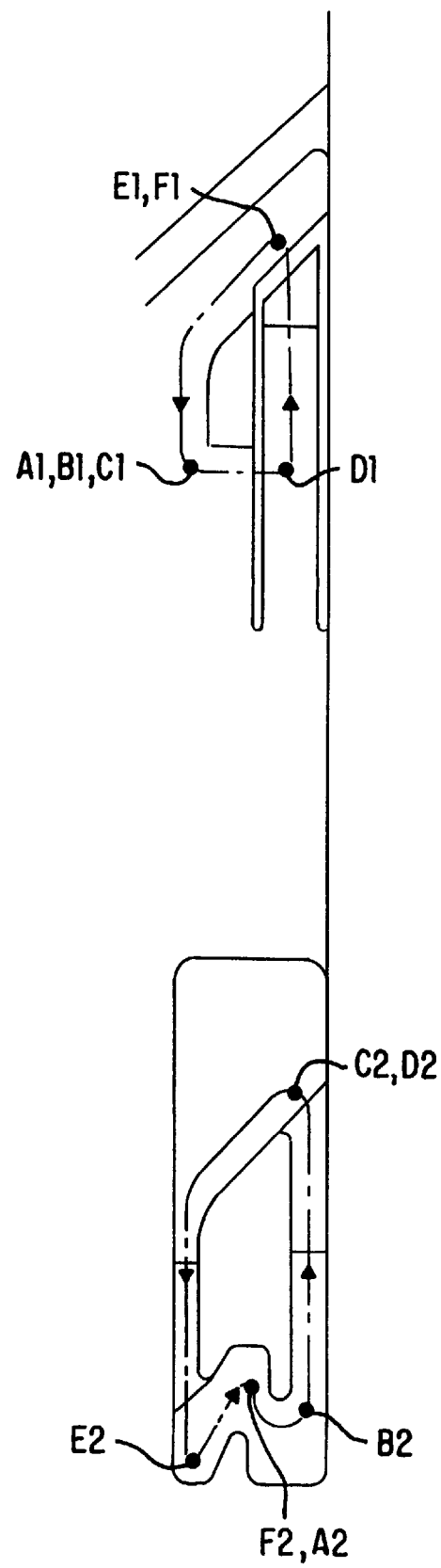
FIG. 8 is a schematic diagram of first and second cam portions.
Figure 9:
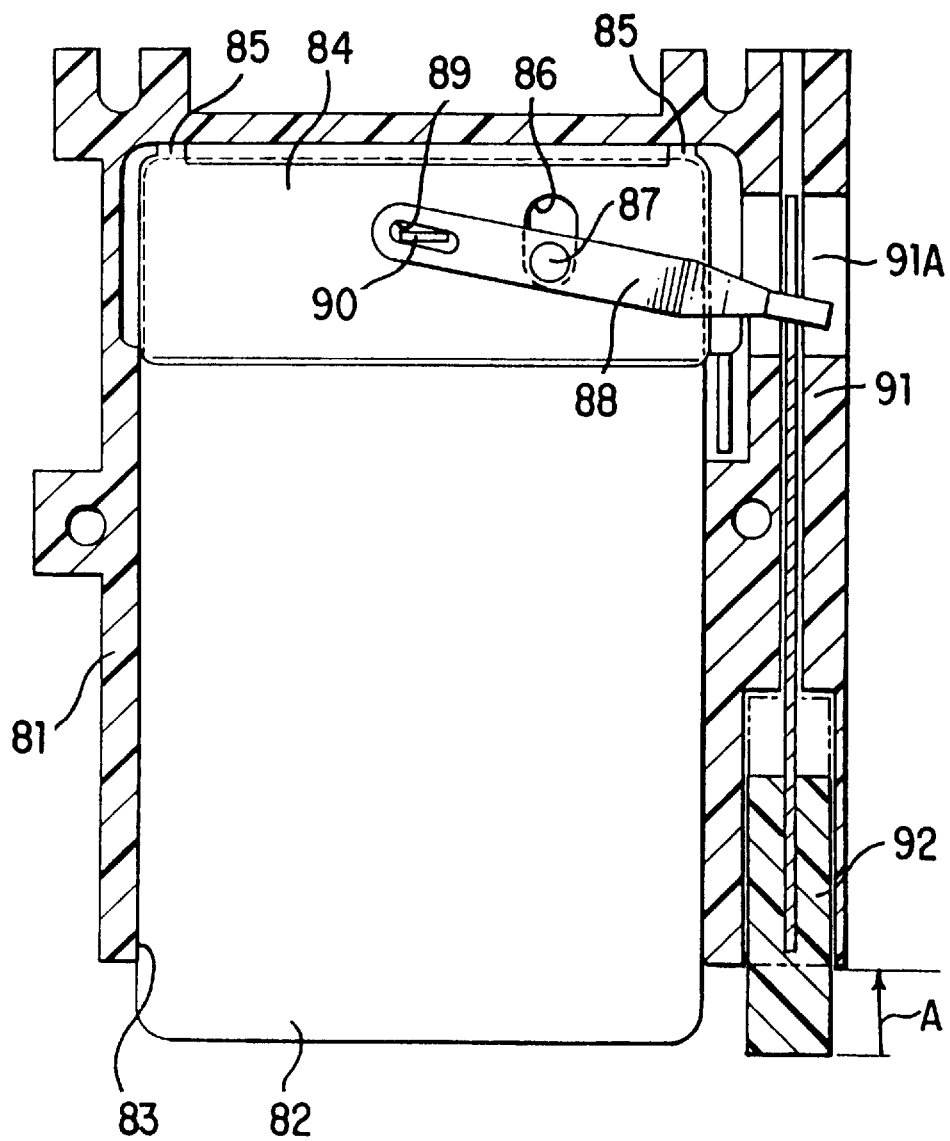
FIG. 9 is a longitudinal section of a conventional connector.

The operation of the electrical connector will now be described with reference to FIGS. 13–8. In FIGS. 3–7, the side walls 42 and 43 are cut off to show the operation of the ejector bar 5, the intermediate bar 10, and the ejector 20 in the case 40. In FIG. 8, the follower stud 13 of the intermediate bar 10 and the engaging portion 63A of the cam member 63 are shown in the second and first cam sections II and I.

Figure 3:
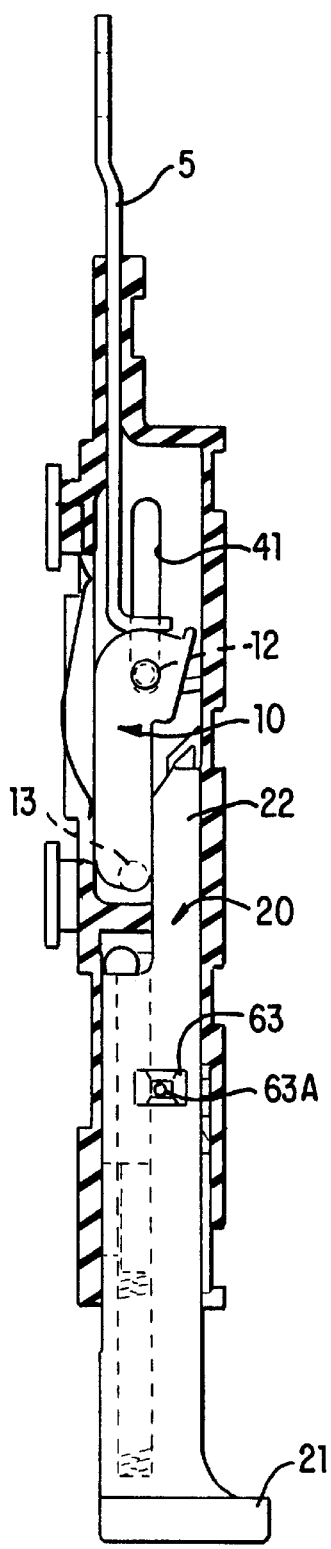
FIG. 3 is a longitudinal section of the electrical connector showing how to remove the PC card.

(1) As FIG. 1 shows, the PC card 1 is inserted into the slot of the housing. The movable plate 2 moves rearwardly to turn the ejector bar 4 about the pivot 3 clockwise so that the ejector bar 5 is moved forwardly. As FIG. 3 shows, the intermediate bar 10 is moved forwardly so that the pivot 12 is moved forwardly along the slot 41. At this point, the ejector button 21 remains depressed, and the follower stud 13 of the intermediate bar 10 is located beside the arm member 22 (position A1 in FIG. 8). The engaging portion 63A of the cam member 63 engages the recess 34 of the guiding channel 33 in the first cam section I (position A2 in FIG. 8) to lock the ejector 20 at a depressed position.

Figure 4:
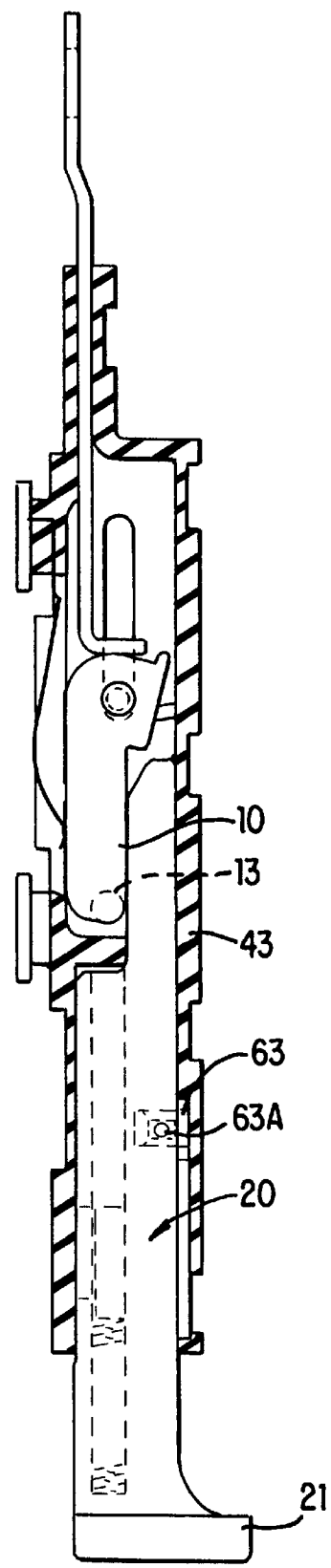
FIG. 4 is a longitudinal section of the electrical connector showing how to remove the PC card.

(2) To remove the PC card, the engaging portion 63A of the cam member 63 is unlocked. To unlock the cam member 63, the ejector button 21 is depressed (first depression). Since the cam member 63 is biased by the spring 62 toward the outside wall 42, the engaging portion 63A of the cam member 63 is moved from the recess 34 of the cam channel 33 to the outside wall 42 (position B2 of FIG. 8) as shown in FIG. 4. The intermediate bar 10 remains at the same position B1 (=A1) of FIG. 8.

(3) When the first depression is released, the ejector 20 is moved forwardly by the compression spring 27 so that the ejector button 21 projects from the case 40 to a large extent. The follower stud 13 of the intermediate bar 10 remains at the same position C1 (=B1) of FIG. 8. When the ejector 20 is moved forwardly, the engaging portion 63A of the cam member 63 is moved to a position C2 in FIG. 8 in preparation for removal of the PC card 1.

(4) When the front end of the intermediate bar 10 is separated from the arm member 22 of the ejector 20, the intermediate bar 10 is turned counterclockwise about the pivot 12 by the leaf spring 49 toward the outside wall 42. Consequently, the follower stud 13 is moved to a position D1 of FIG. 8 so that the load face 14 of the intermediate bar 10 is opposed to the work face 23 of the ejector 20. The engaging portion 63A of the cam member 63 remains at the same position D2 (=C2).

(5) Then, the ejector button 21 is depressed again (second depression) to eject the PC card 1. As FIG. 6 shows, the engaging portion 63A of the cam member 63 is moved from the position D2 to a position E2 of FIG. 8 along the rear edge 35 of the island projection 32 and the engaging step 33A together with the ejector 20. The intermediate bar 10 is moved rearwardly by the ejector 20 with the follower stud 13 is guided from D1 to E1 of FIG. 8. The ejector bar 5 is then moved rearwardly to turn the ejector lever 4 counterclockwise about the pivot 3, thereby ejecting the PC card 1 forwardly.

(6) When the second depression is released, the engaging portion 63A of the cam member 63 is guided to a position F2 (=A2) of FIG. 8 and locked in the recess 34 of the island projection 32. As FIG. 7 shows, the ejector button 21 of the ejector 20 is held at the position where it does not project very much from the case. The follower stud 13 of the intermediate bar 10 is prevented from moving forwardly by the stepped portion of the rear portion 55A of the finger member 55 and locked at the position F1 (=E1) in FIG. 8.

Alternatively, it is possible to replace the ejector lever with an L-shaped lever or cam member turned by the ejector bar or directly the intermediate bar. A pivot is provided at a center of the lever or cam, and one end receives a force from the ejector lever or directly the intermediate bar and the other end transmits the force to the PC card. Also, it is possible to provide the first cam section in the housing and the movable members in the ejector.

As has been described above, the invention includes the ejector which temporarily projects for removal of the PC card but does not project from the housing regardless of the fact that the PC card is used in the connector or not. For this reason, it is minimized to push the ejector accidentally. The ejector mechanism according to the invention is relatively simple.

What is claimed is:

1. A PC card electrical connector comprising:

a housing having a receiving slot for receiving a PC card;

a case having a bottom, an outside wall and an inside wall adjacent to said receiving slot;

an ejector having a front button and a stepped-down rear arm with a work face for forming a stepped space with said inside wall;

first spring means provided between said case and said ejector for forwardly biasing said ejector in a longitudinal direction;

an intermediate bar having a bottom, a rear work face, a front load face for abutment with said work face of said ejector, and a cam follower provided on said bottom near said front load face;

second spring means attached to said inside wall of said case for biasing said load face of said intermediate bar toward said rear arm of said ejector;

an ejector bar having a front load face for abutment with said rear work face of said intermediate bar;

a cam member movable in a direction perpendicular to said longitudinal direction on said bottom of said case and having an engaging portion;

a first cam channel provided on said ejector so as to engage said cam member such that when a PC card is inserted, said engaging portion is held at a lock position where said ejector button is held at a depressed position and, when said ejector button is depressed firstly (first depression), said engaging portion is released from said lock position and, when said ejector button is depressed secondly (second depression), said ejector is moved to a projected position while said engaging portion is returned to said lock position; and a second cam channel provided on said bottom of said case so as to engage said cam follower such that upon insertion of said PC card and said first depression, said load face of said intermediate bar is placed in said stepped space and, upon said second depression, said load face of said intermediate bar is brought to a position opposed to said work face of said ejector, thereby enabling to eject said PC card from said receiving slot.

2. A PC card electrical connector according to claim 1, wherein a stepped portion is provided on said first cam channel for preventing said cam member from moving backwardly.

* * * * *